United States Patent
Sato

(10) Patent No.: US 7,560,999 B2
(45) Date of Patent: Jul. 14, 2009

(54) OSCILLATION CIRCUIT

(75) Inventor: Tomio Sato, Kawasaki (JP)

(73) Assignee: Epson Toyocom Corporation, Tokyo (JP)

( * ) Notice: Subject to any disclaimer, the term of this patent is extended or adjusted under 35 U.S.C. 154(b) by 103 days.

(21) Appl. No.: 11/727,153

(22) Filed: Mar. 23, 2007

(65) Prior Publication Data

US 2007/0241829 A1    Oct. 18, 2007

(30) Foreign Application Priority Data

Mar. 28, 2006  (JP) .............................. 2006-088217

(51) Int. Cl.
*H03B 5/32* (2006.01)
(52) U.S. Cl. ................. 331/116 FE; 331/158
(58) Field of Classification Search ................. 331/158, 331/116 FE
See application file for complete search history.

(56) References Cited

U.S. PATENT DOCUMENTS

| | | | |
|---|---|---|---|
| 6,040,744 A | 3/2000 | Sakurai et al. | |
| 6,215,370 B1 | 4/2001 | Hasegawa et al. | |
| 6,346,862 B2 | 2/2002 | Hasegawa et al. | |
| 7,352,255 B1* | 4/2008 | Green | 331/158 |
| 2004/0189413 A1* | 9/2004 | Satoh | 331/158 |
| 2005/0174183 A1* | 8/2005 | Tachibana et al. | 331/158 |

FOREIGN PATENT DOCUMENTS

| | | |
|---|---|---|
| JP | A-05-129833 | 5/1993 |
| JP | A 8-023230 | 1/1996 |
| JP | A-09-153740 | 6/1997 |
| JP | 60-032817 | 3/1998 |
| JP | A-11-027044 | 1/1999 |
| JP | A-11-88052 | 3/1999 |
| JP | A-11-097929 | 4/1999 |
| JP | A-11-163633 | 6/1999 |
| JP | A 2006-041691 | 2/2006 |

* cited by examiner

*Primary Examiner*—Joseph Chang
(74) *Attorney, Agent, or Firm*—Oliff & Berridge, PLC

(57) ABSTRACT

An oscillation circuit, including: a complementary metal oxide semiconductor (CMOS) inverter coupled between a first potential and a second potential; a first element unit whose one terminal is coupled to an input terminal of the CMOS inverter; a second element unit whose one terminal is coupled to the input terminal of the CMOS inverter and whose other terminal is coupled to an output terminal of the CMOS inverter; a third element unit whose one terminal is coupled to the output terminal of the CMOS inverter; and a fourth element unit whose one terminal is coupled to the other terminal of the first element unit and to the other terminal of the third element unit, and whose other terminal is coupled to either the first potential or the second potential; in that: the first, second, third, and fourth element units are any of a quartz crystal resonator, a resistor, an inductor, and a capacitor; the oscillation circuit oscillating at a frequency determined by the first, second, and third element units.

7 Claims, 16 Drawing Sheets

OSCILLATION CIRCUIT

BACKGROUND

1. Technical Field

The present invention relates to an oscillation circuit using a quartz crystal resonator.

2. Related Art

With reference to a circuit diagram of FIG. 24, an oscillation circuit OSC100 of the related art includes: a complementary metal oxide semiconductor (CMOS) inverter IN100, a quartz crystal resonator X100, resistors R100 (bias resistor) and R200, and capacitors C100 (the capacitance is C1) and C300 (the capacitance is C3). The oscillation circuit OSC100 outputs an oscillation signal OS100 having an oscillation frequency f100 that is determined by the quartz crystal resonator X100 and the capacitors C100, C300. Referring to a block diagram of FIG. 25, the oscillation circuit OSC100 is also expressed as an equivalent circuit including: the CMOS inverter IN100, the resistor R100 connected in parallel to the CMOS inverter IN100, an impedance z1 coupled between an input terminal of the CMOS inverter IN100 and a ground potential GND, an impedance z3 coupled between an output terminal of the CMOS inverter IN100 and the ground potential GND, and an impedance z2 connected in parallel to the CMOS inverter IN100. It should to be noted that the resistor R100 (bias resistor) is to be ignored, since the value of the resistor R100 is extremely high and has a very little influence on the impedance of the circuit side (the impedance determined by the elements, except the quartz crystal resonator X100, that compose the oscillation circuit OSC100 such as the resistor, capacitors, and the quartz crystal resonator).

The oscillation circuit OSC100 shown in FIG. 25 is expressed as a block diagram of FIG. 26. In the oscillation circuit OSC100 in this block diagram, focused on are a p-channel transistor TRP100 and an n-channel transistor TRN100 composing the CMOS inverter IN100, and the impedances z1 and z3 are each divided into two.

The oscillation circuit 100 shown in FIG. 26 is also expressed as an equivalent circuit shown in FIG. 27. "gm" here indicates mutual conductance (A/V) of the p-channel transistor TRP100 and the n-channel transistor TRN100.

From the relation between the current and voltage of the oscillation circuit OSC100 in FIG. 27, equations 1, 2, and 3 are given. If the impedance z2 of the quartz crystal resonator X100 is replaced, for the convenience sake, by an impedance zxt and put into the equation 3, an equation 4 is given. Also, the impedances z1 and z3 are given by equations 5, and, when these equations 5 are substituted into the equation 4, an equation 6 is provided. "Rc" here indicates resistance of the circuit side of the oscillation circuit OSC100, that is, circuit resistance (resistance determined by the elements, except the quartz crystal resonator X100, that compose the oscillation circuit OSC100 such as the resistor, capacitors, and the quartz crystal resonator). Also, "Cc" indicates capacitance of the circuit side, that is, circuit capacitance (capacitance determined by the elements, except the quartz crystal resonator X100, that compose the oscillation circuit OSC100 such as the resistor, capacitors, and the quartz crystal resonator).

When the equation 6 is solved with respect to the circuit resistance Rc and the circuit capacitance Cc, equations 7 are given.

Referring to the graph of FIG. 28 showing the simulation results concerning the equations 7, the value of the circuit capacitance Cc of the oscillation circuit OSC100 is constant regardless of the oscillation frequency f100. In contrast, the value (absolute value) of the circuit resistance Rc becomes high as the oscillation frequency f100 becomes low and converges to a constant value as the oscillation frequency f100 becomes higher.

Equation 1

$$i_2 = 2i_1 \quad (1)$$

Equation 2

$$2i_3 = i_2 + 4g_m z_1 i_1 \rightarrow 2i_3 = 2(1 + 2g_m z_1) \cdot i_1 \quad (2)$$

Equation 3

$$2z_1 i_1 + z_2 i_2 + 2z_3 i_3 = 0 \rightarrow z_1 + z_2 + z_3 + 2g_m z_1 z_3 = 0 \quad (3)$$

Equation 4

$$z_{xt} + z_1 + z_3 + 2g_m z_1 z_3 = 0 \quad (4)$$

Equation 5

$$z_1 = \frac{1}{j\omega \cdot C_1} \quad (5)$$

$$z_3 = \frac{1}{j\omega \cdot C_3}$$

Equation 6

$$z_{xt} - \frac{2g_m}{\omega^2 C_1 C_3} + \frac{1}{j\omega}\left(\frac{1}{C_1} + \frac{1}{C_3}\right) = z_{xt} + R_c + \frac{1}{j\omega \cdot C_c} = 0 \quad (6)$$

Equation 7

$$R_C = \frac{2g_m}{\omega^2 C_1 C_2} \quad (7)$$

$$\frac{1}{C_c} = \frac{1}{C_1} + \frac{1}{C_3}$$

However, because the oscillation circuit OSC100 does not have such sharp frequency characteristics that the value (absolute value) of the circuit resistance Rc becomes markedly high at a specific frequency, that is, because the frequency selectivity (Q) is low, the oscillation circuit OSC100 may oscillate at frequencies other than the oscillation frequency f100.

The capacitors C100 and C300 work in cooperation with the quartz crystal resonator X100 to determine the oscillation frequency f100 as described above; however, the capacitors C100 and C300 also determine the value of the circuit resistance Rc as apparent in the equations 7. Thus, there has been a problem that the wave of the oscillation signal OS100 does not become sinusoidal.

SUMMARY

An advantage of the invention is to provide an oscillation circuit avoiding the above problem. According to an aspect of the invention, a oscillation circuit includes: a CMOS inverter coupled between a first potential and a second potential; a first element unit whose one terminal is coupled to an input terminal of the CMOS inverter; a second element unit whose one terminal is coupled to the input terminal of the CMOS inverter and whose other terminal is coupled to an output terminal of the CMOS inverter; a third element unit whose one terminal is coupled to the output terminal of the CMOS inverter; and a fourth element unit whose one terminal is coupled to the other terminal of the first element unit and to the other terminal of the third element unit, and whose other terminal is coupled to either the first potential or the second potential; in that: the first, second, third, and fourth element units are any of a quartz crystal resonator, a resistor, an inductor, and a capacitor, the oscillation circuit oscillating at a frequency determined by the first, second, and third element units.

Since the oscillation circuit of the invention includes the first, second, third, and fourth element units provided at positions as stated above, it is possible to prevent the chance of oscillation at frequencies other than a desired frequency and to make the waveform of the output oscillation frequency to be close to that of a sinusoidal wave.

It is preferable that the oscillation circuit be such that: the first and third element units are capacitors; the second element unit is a quartz crystal resonator; and the fourth element unit is a resistor.

It is preferable that the oscillation circuit be such that: the first element unit is a quartz crystal resonator; the second element unit is a capacitor; the third element unit is an inductor; and the fourth element unit is a resistor.

It is preferable that the oscillation circuit be such that: the first element unit is an inductor; the second element unit is a capacitor; the third element unit is a quartz crystal resonator; and the fourth element unit is a resistor.

It is preferable that the oscillation circuit be such that: the first and third element units are capacitors; the second element unit is a capacitor and an inductor connected serially to each other; and the fourth element unit is a quartz crystal resonator.

It is preferable that the oscillation circuit be such that: the first, third, and fourth element units are capacitors; and the second element unit is a quartz crystal resonator.

It is preferable that the oscillation circuit be such that: the first and third element units are capacitors; the second element unit is a quartz crystal resonator; and the fourth element unit is an inductor and a capacitor connected serially to each other.

BRIEF DESCRIPTION OF THE DRAWINGS

The invention will be described with reference to the accompanying drawings, wherein like numbers reference like elements.

DESCRIPTION OF EXEMPLARY EMBODIMENT

An embodiment of the oscillation circuit of the invention will now be described with reference to the drawings.

Basic Principles of Embodiment

Figure 1:
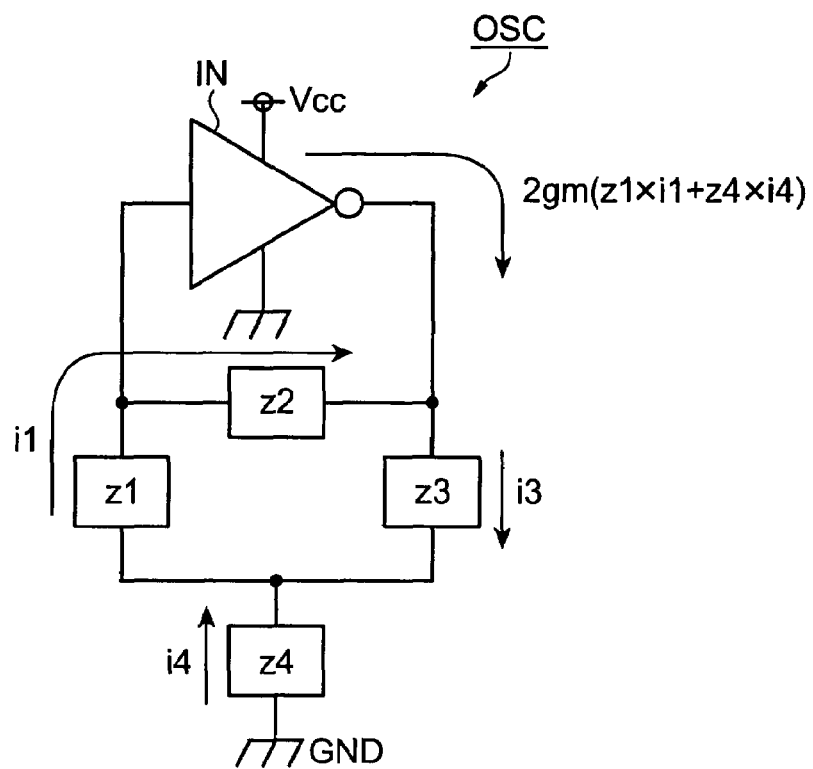
FIG. 1 is a diagram showing a basic model of an oscillation circuit of an embodiment.

FIG. 1 shows a basic model of an oscillation circuit OSC of the embodiment. Referring to FIG. 1, the oscillation circuit OSC of the basic model includes: an inverter IN, a first impedance z1, a second impedance z2, a third impedance z3, and a fourth impedance z4. The inverter IN is provided between a power potential Vcc (e.g., +5V) and a ground potential GND. One terminal of the first impedance z1 is coupled to an input terminal of the inverter IN, and the other terminal is coupled to one terminal of the fourth impedance z4. One terminal of the second impedance z2 is coupled to the input terminal of the inverter IN, and the other terminal is coupled to an output terminal of the inverter IN, in other words, the second impedance z2 is connected in parallel to the inverter IN. One terminal of the third impedance z3 is coupled to the output terminal of the inverter IN, and the other terminal is coupled to one terminal of the fourth impedance z4. The other terminal of the fourth impedance z4 is coupled to the ground potential GND.

When, as illustrated in FIG. 1, a current flowing to the first and second impedances z1 and z2 is defined as a current i1; a current flowing to the third impedance z3 is defined as a current i3, a current flowing to the fourth impedance z4 is defined as a current i4; and a mutual conductance of a p-channel metal oxide semiconductor field effect transistor (MOSFET) and an n-channel MOSFET (both not shown) composing the inverter IN as gm, equations 8, 9, and 10 are given.

Equation 8

$$i_1 + 2g_m(z_1 i_1 + z_4 i_4) = i_3 \qquad (8)$$

Equation 9

$$i_1 = i_3 + i_4 \qquad (9)$$

Equation 10

$$(z_1+z_2)i_1 + z_3 i_3 = 0 \qquad (10)$$

Also, the equations 8 to 10 yield an equation 11 which shows the relations of the impedances z1 to z4 of the oscillation circuit OSC.

Equation 11

$$z_1 + z_2 + z_3 + \frac{z_1 z_3}{\frac{1}{2g_m} + z_4} = 0 \qquad (11)$$

When z2=zxt and substituted into the equation 11, an equation 12 is given showing the relations of the impedances z1 to z4 of the oscillation circuit OSC when z2=zxt.

Equation 12

$$z_{xt} + z_1 + z_3 + \frac{z_1 z_3}{\frac{1}{2g_m} + z_4} = 0 \qquad (12)$$

When z1=zxt and substituted into the equation 11, an equation 13 is given. Also, when the equation 13 is modified, an equation 14 is given showing the relations of the impedances z1 to z4 of the oscillation circuit OSC when z1=zxt.

Equation 13

$$z_{xt} + z_2 + z_3 + \frac{z_{xt} z_3}{\frac{1}{2g_m} + z_4} = 0 \qquad (13)$$

Equation 14

$$z_{xt} + \frac{z_2 + z_3}{1 + y_{4g} z_3} = 0 \qquad (14)$$

$$\Theta y_{4g} = \frac{1}{\frac{1}{2g_m} + z_4}$$

When z3=zxt and substituted into the equation 11, an equation 15 is given showing the relations of the impedances z1 to z4 of the oscillation circuit OSC when z3=zxt.

Equation 15

$$z_{xt} + \frac{z_1 + z_2}{1 + y_{4g} z_1} = 0 \qquad (15)$$

$$\Theta y_{4g} = \frac{1}{\frac{1}{2g_m} + z_4}$$

When z4=zxt and substituted into the equation 11, an equation 16 is given. Also, when the equation 16 is modified, an equation 17 is given showing the relations of the impedances z1 to z4 of the oscillation circuit OSC when z4=zxt.

Equation 16

$$z_1 + z_2 + z_3 + \frac{z_1 z_3}{\frac{1}{2g_m} + z_{xt}} = 0 \qquad (16)$$

Equation 17

$$z_{xt} + \frac{1}{2g_m} + \frac{z_1 z_3}{z_1 + z_2 + z_3} = 0 \qquad (17)$$

EXAMPLE 1

Figure 2:
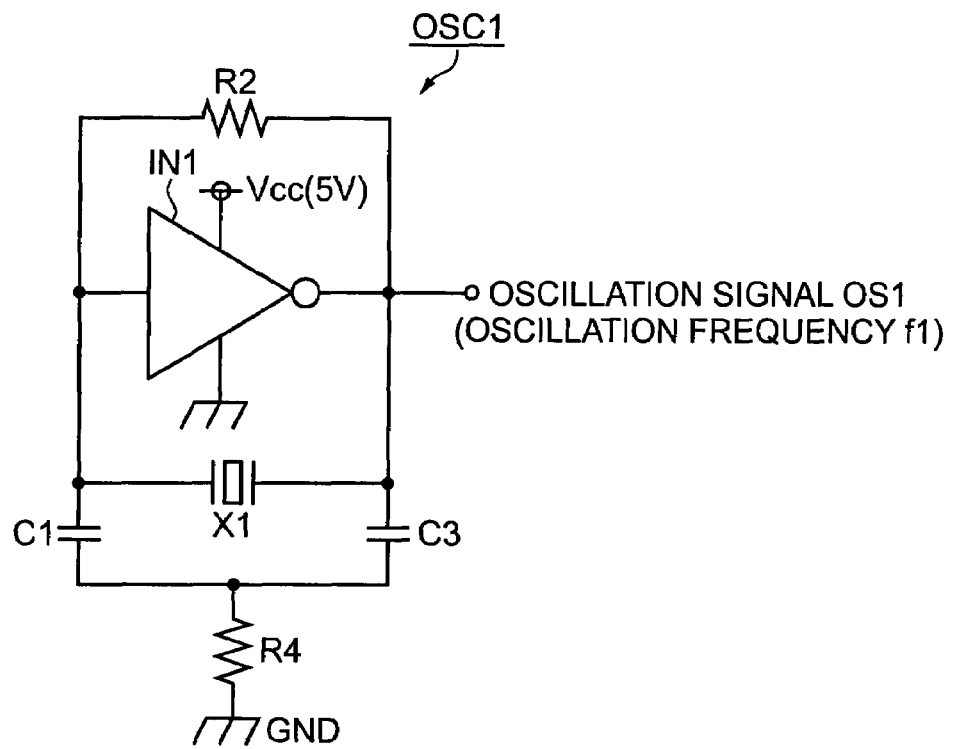
FIG. 2 is a diagram showing the structure of an oscillation circuit of a first example.

Referring to FIG. 2, an oscillation circuit OSC1 of an example 1 includes, as the inverter IN and the first to fourth impedances z1 to z4 of the oscillation circuit OSC of FIG. 1, an inverter IN1, a capacitor C1, a quartz crystal oscillator X1, a capacitor C3, and a resistor R4, and also includes a resistor R2 as a bias resistance.

The first to fourth impedances z1 to z4 are defined as shown in equations 18. When the equations 18 are substituted into the equation 12 that is the basic formula for z2=zxt, an equation 19 is given. Also, when the equation 19 is solved with respect to a circuit resistance Rc and a circuit capacitance Cc, equations 20 are given.

Equation 18

$$z_1 = \frac{1}{j\omega . C_1} \qquad (18)$$

$$z_2 = z_{xt}$$

$$z_3 = \frac{1}{j\omega . C_3}$$

$$z_4 = R_4$$

Equation 19

$$z_{xt} + \frac{1}{j\omega.}\left(\frac{1}{C_1} + \frac{1}{C_3}\right) - \frac{1}{\omega^2 C_1 C_3} \times \frac{1}{\frac{1}{2g_m} + R_4} = R_c + \frac{1}{j\omega.C_c} = 0 \qquad (19)$$

Equation 20

$$R_c = -\frac{1}{\omega^2 C_1 C_3} \times \frac{1}{\frac{1}{2g_m} + R_4} \qquad (20)$$

$$\frac{1}{C_c} = \frac{1}{C_1} + \frac{1}{C_3}$$

Figure 3:
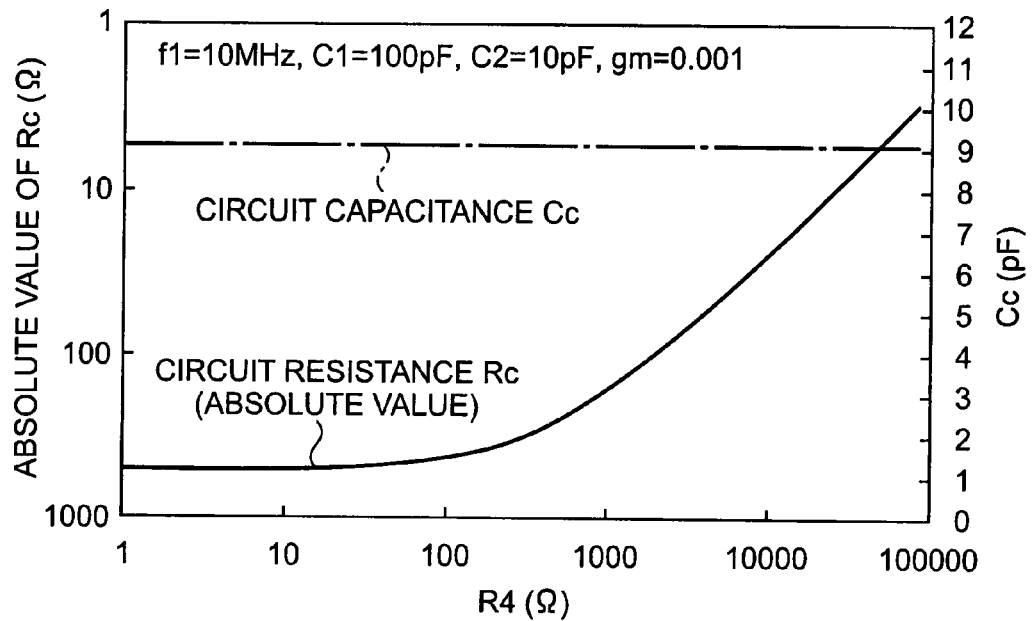
FIG. 3 is a diagram showing simulation results of the oscillation circuit of the first example.

Pertaining to the equations 20 of the oscillation circuit OSC1 of the example 1, when a simulation is performed provided that the oscillation frequency f1 of an oscillation signal OS1=10 MHz, the capacitor C1=100 pF, the capacitor C2=10 pF, and the mutual conductance gm=0.001, a graph as illustrated in FIG. 3 is obtained. Referring to the graph of FIG. 3, the value (absolute value) of the circuit resistance Rc can be set relatively small when the resistor R4 is in the range of from approximately 500 Ω to 50,000 Ω. As a consequence, the waveform of the oscillation signal OS1 can become close to sinusoidal.

Figure 4:
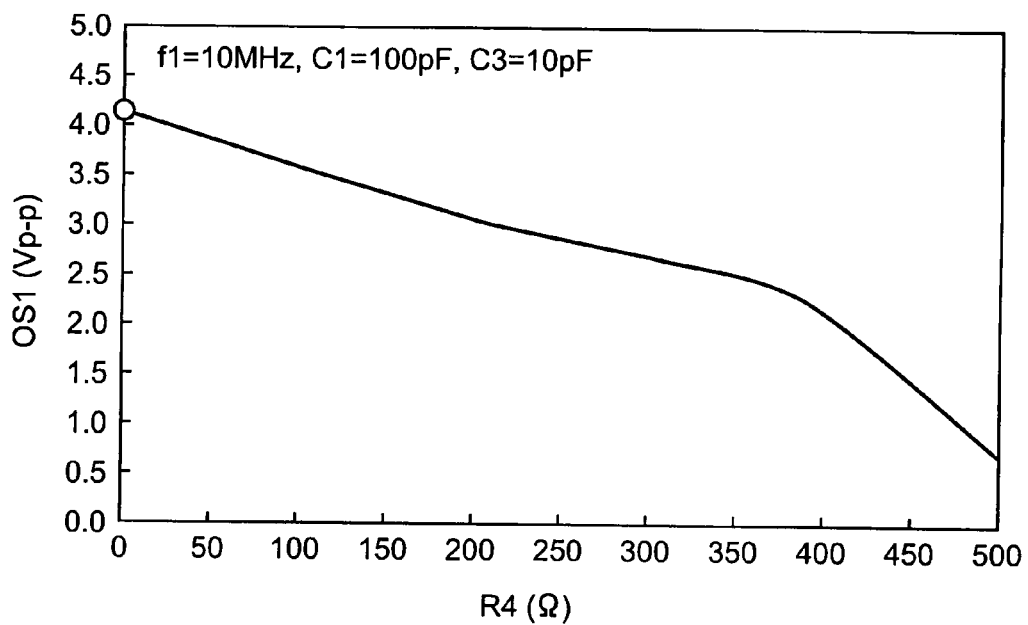
FIG. 4 is a diagram showing experimental results (1) of the oscillation circuit of the first example.
Figure 5:
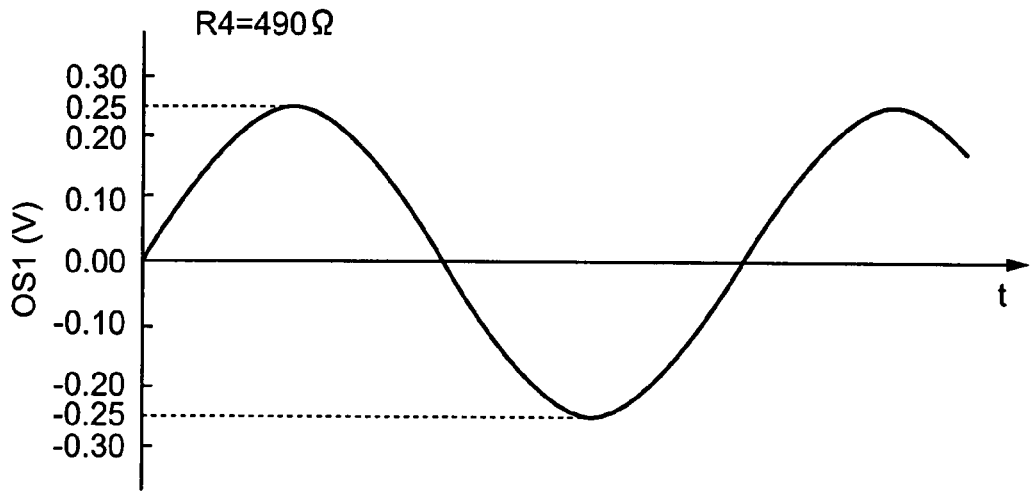
FIG. 5 is a diagram showing experimental results (2) of the oscillation circuit of the first example.

FIGS. 4 and 5 are the experimental results of the oscillation circuit of the example 1. In this experiment, the values of the oscillation frequency f1 and the capacitors C1 and C2 are the same as those in the simulation above. Referring to FIG. 4, when the resistor R4 is larger than around 380 Ω, the oscillation signal OS1 has a good sinusoidal wave. For example, referring to FIG. 5, when the resistor R4=490 Ω, the oscillation signal OS1 is outputted as a very good sinusoidal wave (0.5 Vp-p), that is, as a wave having a very little waveform distortion.

EXAMPLE 2

Figure 6:
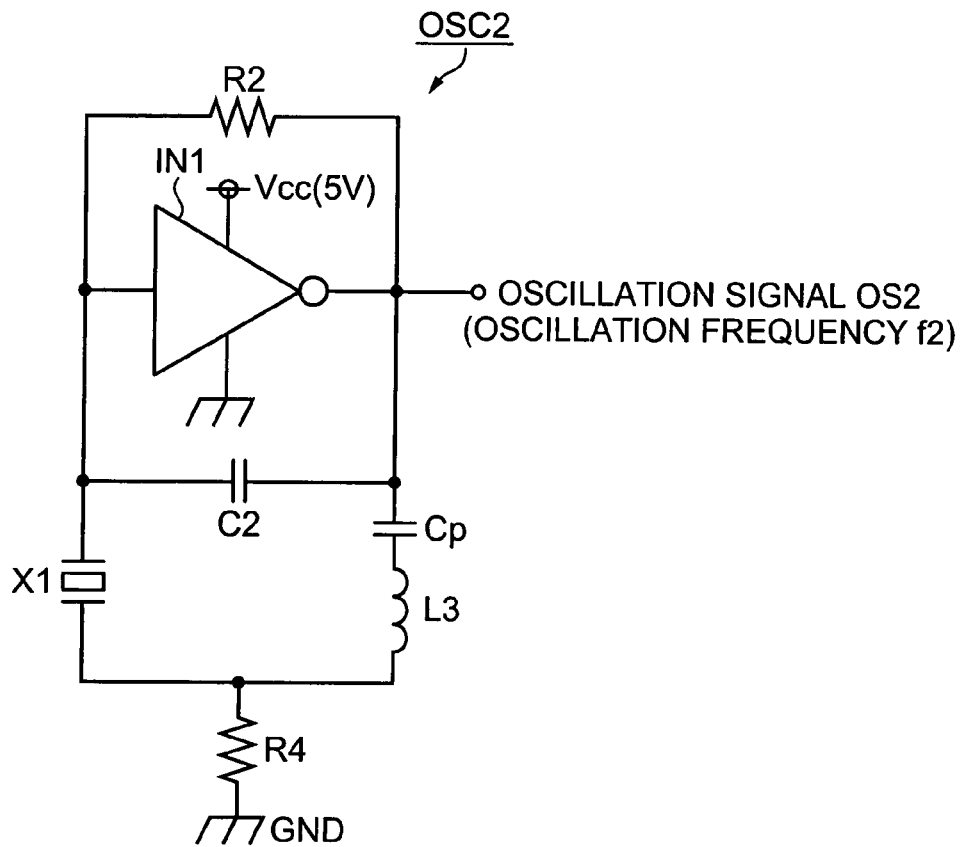
FIG. 6 is a diagram showing the structure of an oscillation circuit of a second example.

With reference to FIG. 6, an oscillation circuit OSC2 of an example 2 includes, as the inverter IN and the first to fourth impedances z1 to z4 of the oscillation circuit OSC of FIG. 1, the inverter IN1, the quartz crystal oscillator X1, a capacitor C2, an inductor L3 and a bypass condenser Cp, and the resistor R4, and also includes the bias resistor R2.

The first to fourth impedances z1 to z4 in this case are defined as shown in equations 21. When the equations 21 are substituted into the equation 14 that is the basic formula for z1=zxt, an equation 22 is given. Also, when the equation 22 is solved with respect to the circuit resistance Rc and the circuit capacitance Cc, equations 23 and 24 are given.

Equation 21

$$z_1 = z_{xt} \quad (21)$$
$$z_2 = \frac{1}{j\omega.C_2}$$
$$z_3 = j\omega.L_3$$
$$\omega_{23}^2 = \frac{1}{C_2 L_3}$$
$$z_4 = R_4$$

Equation 22

$$z_{xt} = \frac{2g_m(1+2g_m R_4)}{\left(\frac{2g_m\omega^2}{\omega_{23}^2}\right)^2 + \{\omega.C_2(1+2g_m R_4)\}^2} \times \left(1 - \frac{\omega^2}{\omega_{23}^2}\right)\frac{\omega^2}{\omega_{23}^2} + \quad (22)$$
$$\frac{1}{j\omega} \frac{\omega^2.C_2(1+2g_m R_4)^2}{\left(\frac{2g_m\omega^2}{\omega_{23}^2}\right)^2 + \{\omega.C_2(1+2g_m R_4)\}^2} \times \left(1 - \frac{\omega^2}{\omega_{23}^2}\right) =$$
$$z_{xt} + R_c + \frac{1}{j\omega.C_c} = 0$$

Equation 23

$$R_c = -\frac{2g_m(1+2g_m R_4)}{\left(\frac{2g_m\omega^2}{\omega_{23}^2}\right)^2 + \{\omega.C_2(1+2g_m R_4)\}^2} \times \left(1 - \frac{\omega^2}{\omega_{23}^2}\right)\frac{\omega^2}{\omega_{23}^2} \quad (23)$$

Equation 24

$$\frac{1}{C_c} = \frac{\omega^2.C_2(1+2g_m R_4)^2}{\left(\frac{2g_m\omega^2}{\omega_{23}^2}\right)^2 + \{\omega.C_2(1+2g_m R_4)\}^2} \times \left(1 - \frac{\omega^2}{\omega_{23}^2}\right) \quad (24)$$

Figure 7:
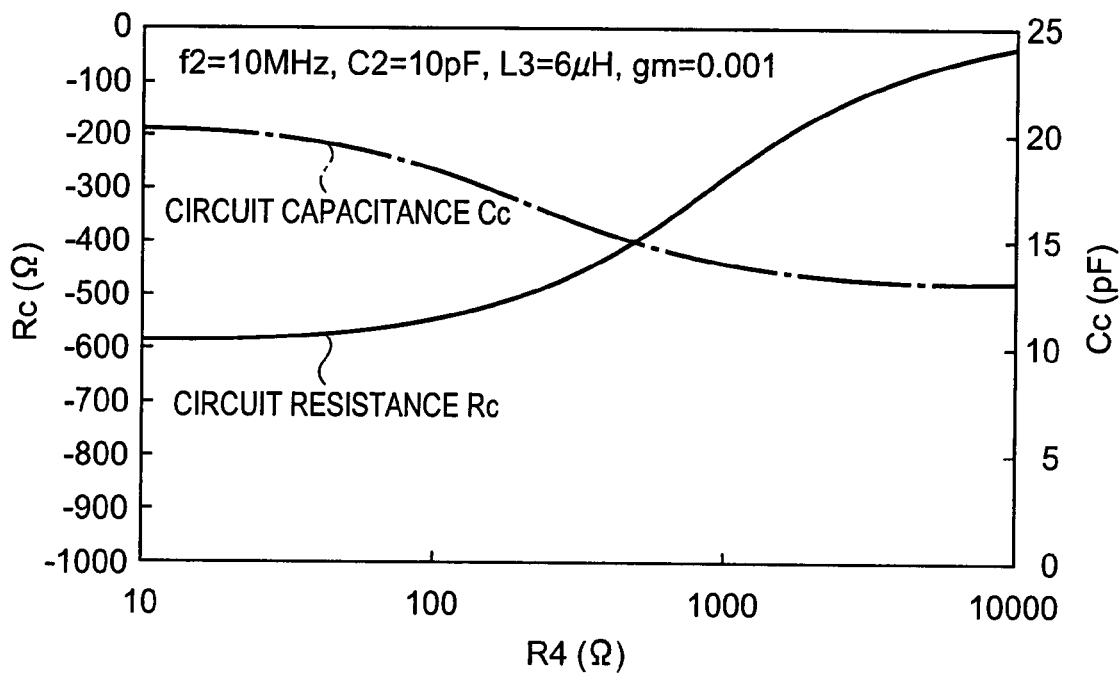
FIG. 7 is a diagram showing simulation results of the oscillation circuit of the second example.

Pertaining to the equations 23 and 24, when a simulation is performed provided that an oscillation frequency f2 of an oscillation signal OS2=10 MHz, the capacitor C2=10 pF, the inductor L3=6 µH, and the mutual conductance gm=0.001, a graph as illustrated in FIG. 7 is obtained. Referring to the graph of FIG. 7, the greater the value of the resistor R4 is, the smaller the value (absolute value) of the circuit resistance Rc becomes. Consequently, the waveform of the oscillation signal OS2 can be readily made close to sinusoidal.

Figure 8:
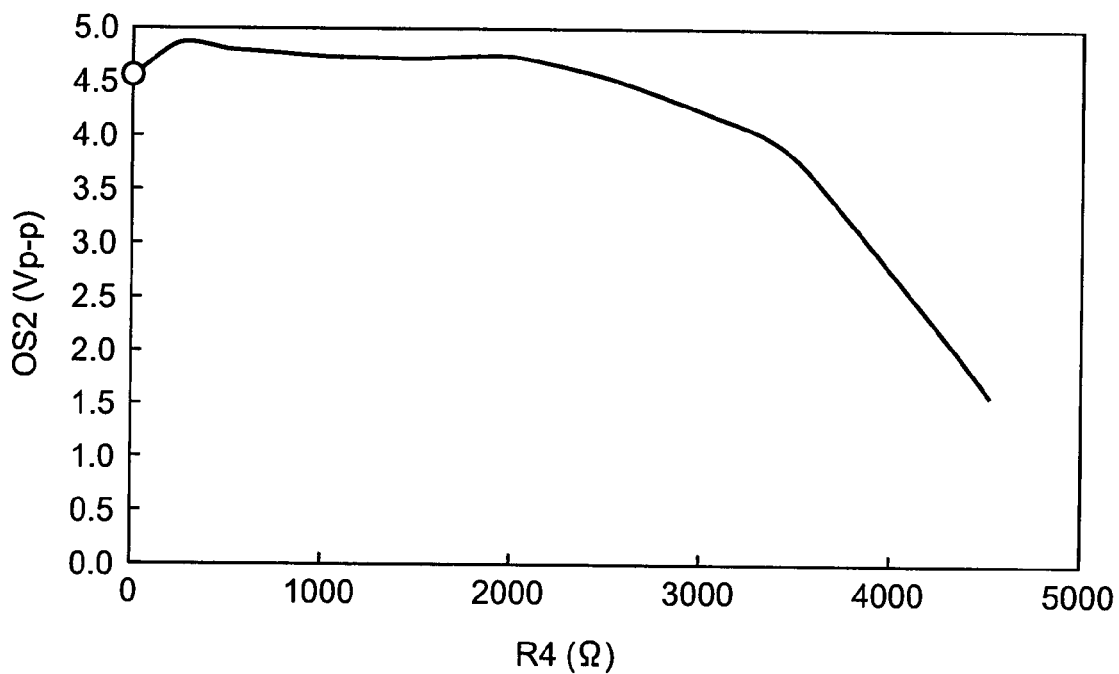
FIG. 8 is a diagram showing experimental results (1) of the oscillation circuit of the second example.
Figure 9:
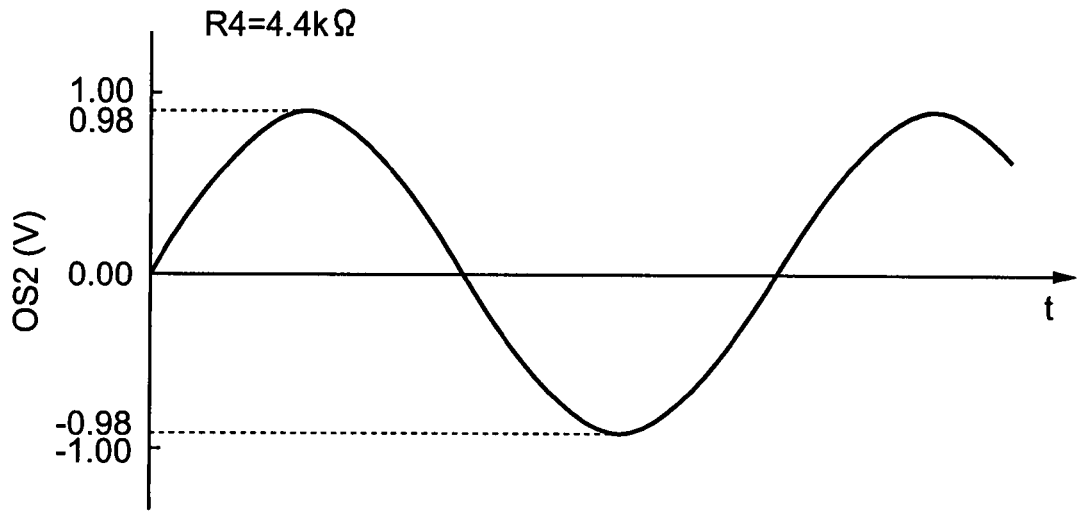
FIG. 9 is a diagram showing experimental results (2) of the oscillation circuit of the second example.

FIGS. 8 and 9 are the experimental results of the oscillation circuit of the example 2. In this experiment, the values of the oscillation frequency f2 and the capacitors C2 and C3 are the same as those in the simulation above. Referring to FIG. 8, when the resistor R4 is larger than 3,500 Ω, the oscillation signal OS2 becomes a good sinusoidal wave. For example, with reference to FIG. 9, when the resistor R4=4.4 kΩ, the oscillation signal OS2 becomes a very good sinusoidal wave, and, moreover, an amplitude (1.96 Vp-p) larger than the amplitude of the example 1 (0.5 Vp-p) can be obtained.

EXAMPLE 3

Figure 10:
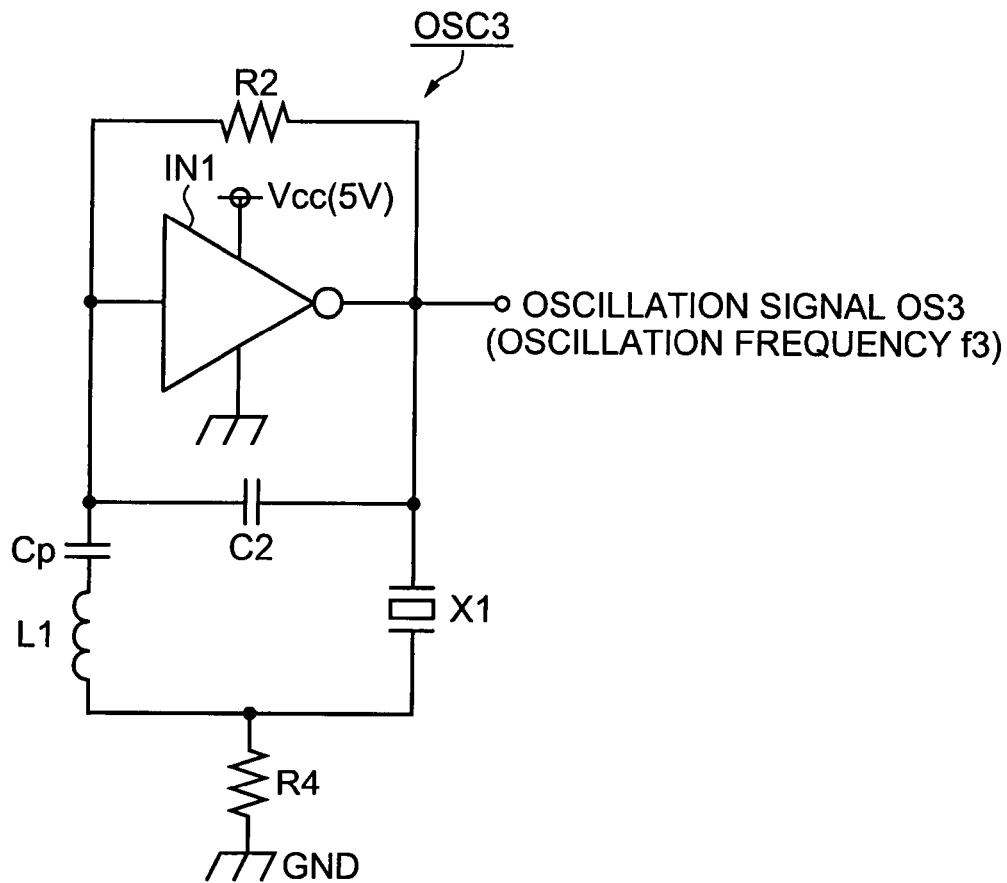
FIG. 10 is a diagram showing the structure of an oscillation circuit of a third example.

With reference to FIG. 10, an oscillation circuit OSC3 of an example 3 includes, as the inverter IN and the first to fourth impedances z1 to z4 of the oscillation circuit OSC of FIG. 1, the inverter IN1, an inductor L1 and the bypass condenser Cp, the capacitor C2, the quartz crystal oscillator X1, and the resistor R4, and also includes the bias resistor R2.

The circuit resistance Rc and the circuit capacitance Cc of the oscillation circuit OSC3 of the example 3 are given in the equations 23 and 24, as in the case with the circuit resistance Rc and the circuit capacitance Cc of the oscillation circuit OSC2 of the example 2.

Figure 11:
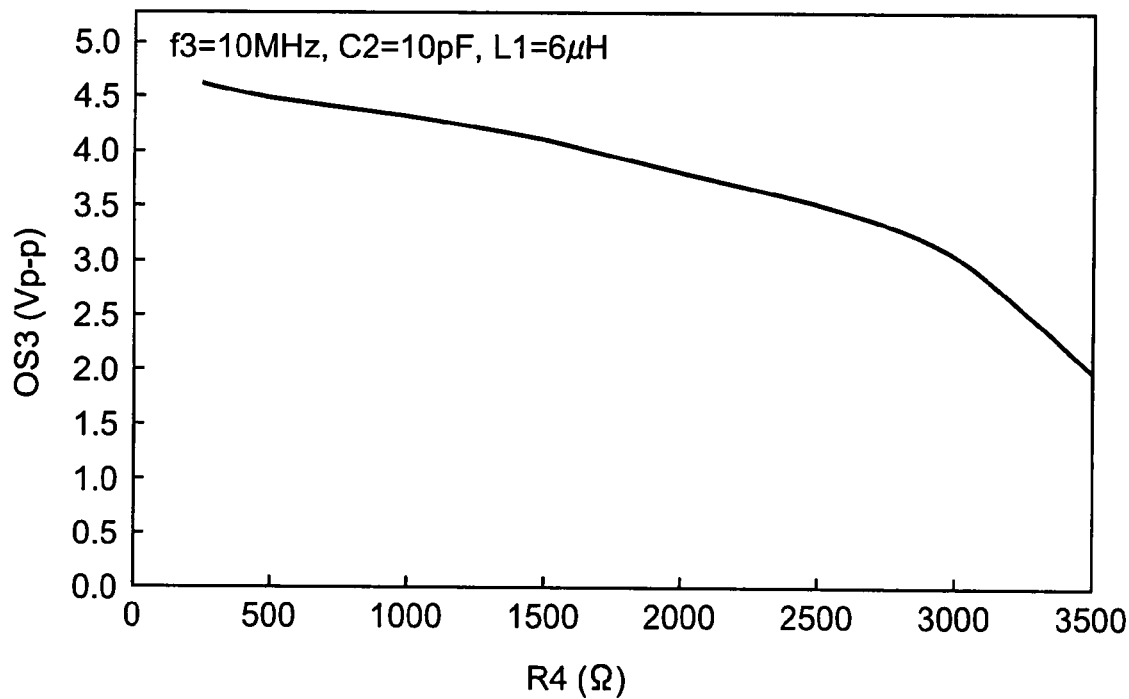
FIG. 11 is a diagram showing experimental results (1) of the oscillation circuit of the third example.
Figure 12:
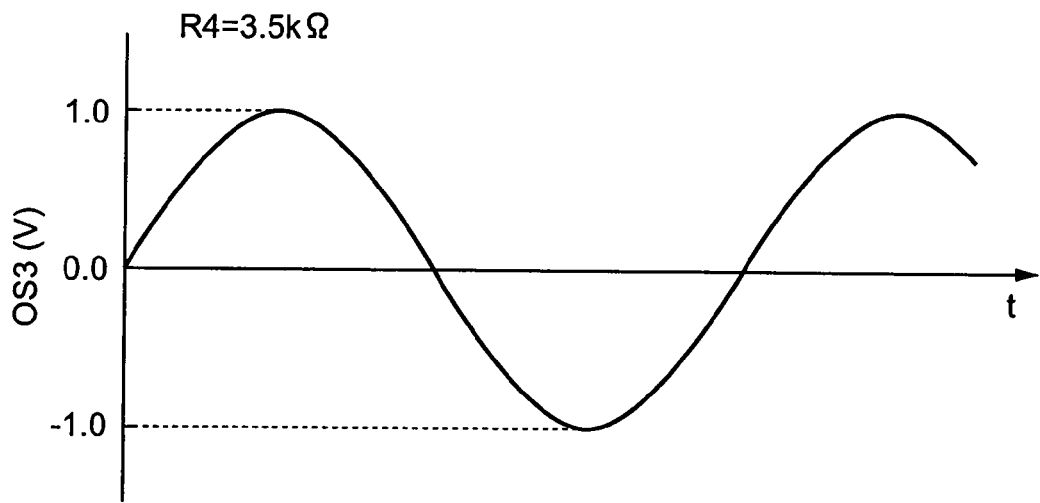
FIG. 12 is a diagram showing experimental results (2) of the oscillation circuit of the third example.

FIG. 11 shows the experimental results of the oscillation circuit of the example 3. In this experiment, the oscillation frequency f3 of an oscillation signal OS3=10 MHz, the capacitor C2=10 pF, and the inductor L1=6 µH. Referring to FIG. 11, when the resistor R4 is greater than around 2,500 Ω, the oscillation signal OS3 becomes a good sinusoidal wave. For example, with reference to FIG. 12, when the resistor R4=3.5 kΩ, the oscillation signal OS3 becomes a very good sinusoidal wave as in the case with the oscillation signals OS1 and OS2 of the examples 1 and 2, and, moreover, a large amplitude (2.00 Vp-p) can be obtained as in the case with the oscillation signal OS2.

EXAMPLE 4

Figure 13:
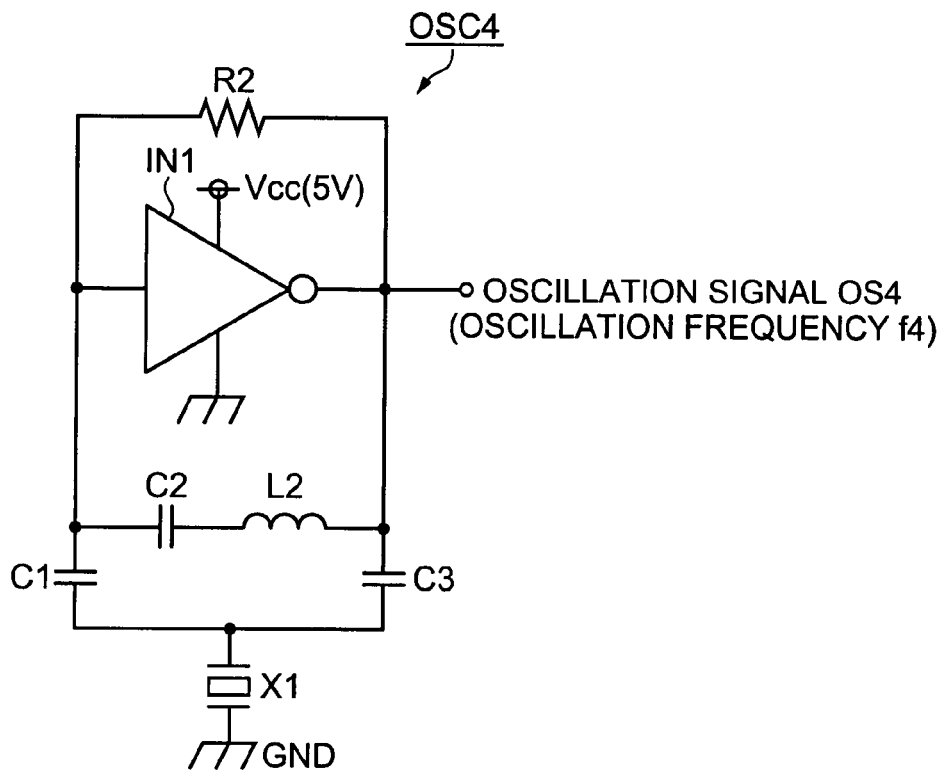
FIG. 13 is a diagram showing the structure of an oscillation circuit of a fourth example.

With reference to FIG. 13, an oscillation circuit OSC4 of an example 4 includes, as the inverter IN and the first to fourth impedances z1 to z4 of the oscillation circuit OSC of FIG. 1, the inverter IN1, the capacitor C1, the capacitor C2 and the inductor L2, the capacitor C3, and the quartz crystal oscillator X1, and also includes the bias resistor R2. In this case, natural frequency f4X of the quartz crystal resonator X1 is substantially the same as resonance frequency f4LC determined by the capacitor C1, the capacitor C2, the inductor L2, and the capacitor C3.

The first to fourth impedances z1 to z4 in this case are defined as shown in equations 25 and 26. When the equations 25 and 26 are substituted into the equation 17 that is the basic formula for z4=zxt, an equation 27 is given. Also, when the equation 27 is solved with respect to the circuit resistance Rc and the circuit capacitance Cc, equations 28 and 29 are given.

Equation 25

$$z_4 = z_{xt} \quad (25)$$
$$z_1 = \frac{1}{j\omega.C_1}$$
$$z_2 = R_a + j\omega.L_a$$
$$z_3 = \frac{1}{j\omega.C_3}$$

Equation 26

-continued $$R_a = \frac{R_2}{1 + \left(\frac{R_2}{\omega . L_b}\right)^2} \quad (26)$$

$$L_a = \frac{R_a R_2}{\omega^2 L_b}$$

$$L_b = L_2\left(1 - \frac{\omega_2^2}{\omega^2}\right)$$

Equation 27

$$z_{xt} + \frac{1}{2g_m} - \frac{1}{\omega^2 C_1 C_3} \times \frac{1}{R_a + j\omega.L_a + \frac{1}{j\omega}\left(\frac{1}{C_1} + \frac{1}{C_3}\right)} = \quad (27)$$

$$z_{xt} + R_c + \frac{1}{j\omega.C_c} = 0$$

Equation 28

$$R_c = \frac{1}{2g_m} - \frac{1}{\omega^2 C_1 C_3} \times \frac{R_a}{R_a^2 + \left\{\omega.L_a\left(1 - \frac{\omega_a^2}{\omega^2}\right)\right\}^2} \quad (28)$$

Equation 29

$$\frac{1}{C_c} = \frac{1}{C_1 C_3} \times \frac{L_a\left(1 - \frac{\omega_a^2}{\omega^2}\right)}{R_a^2 + \left\{\omega.L_a\left(1 - \frac{\omega_a^2}{\omega 2}\right)\right\}^2} \quad (29)$$

$$\Theta \omega_a^2 = \frac{1}{L_a}\left(\frac{1}{C_1} + \frac{1}{C_3}\right)$$

Figure 14:
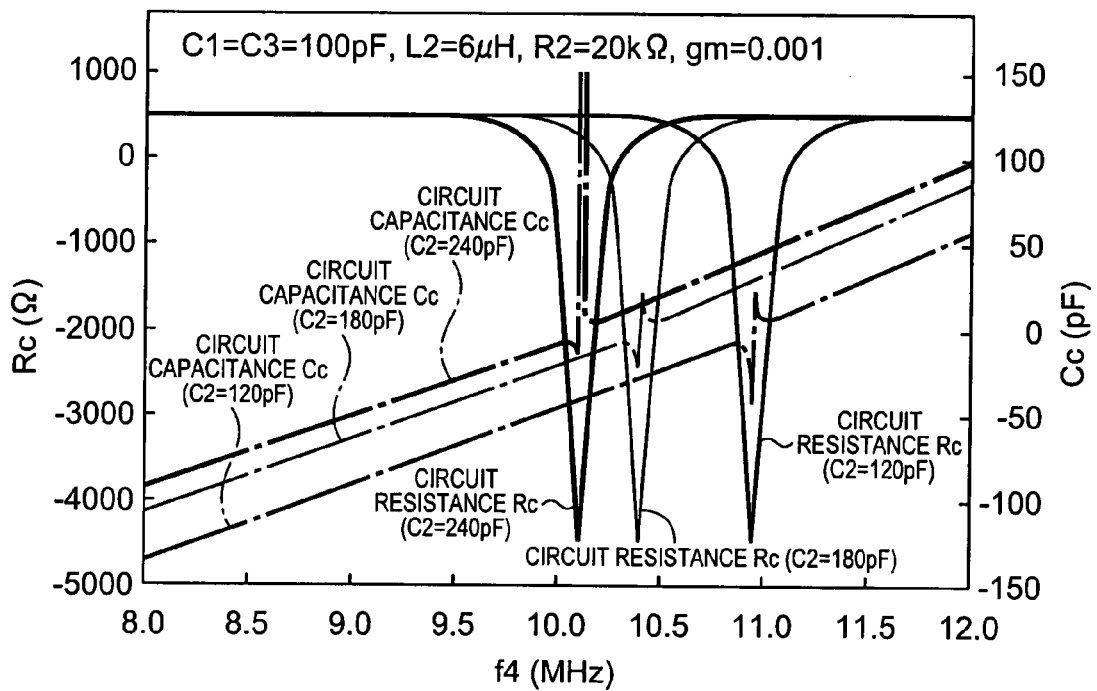
FIG. 14 is a diagram showing simulation results (1) of the oscillation circuit of the fourth example.

With respect to the equations 28 and 29, when the capacitor C2 is used as the parameter, and when a simulation is performed provided that the capacitors C1=C3=100 pF, the inductor L2=6 µH, the resistor R2=20 kΩ, and the mutual conductance gm=0.001, a graph as shown in FIG. 14 is obtained. Referring to the graph of FIG. 14, the circuit resistance Rc has the narrow band characteristics for each capacitor C2 being 120 pF, 180 pF, and 240 pF. That is, roughly stated, the circuit resistance Rc at 10.1 MHz, 10.4 MHz, and 10.9 MHz has the minimum values of −4.5 kΩ, −4.4 kΩ, and −4.6 kΩ, respectively.

Figure 15:
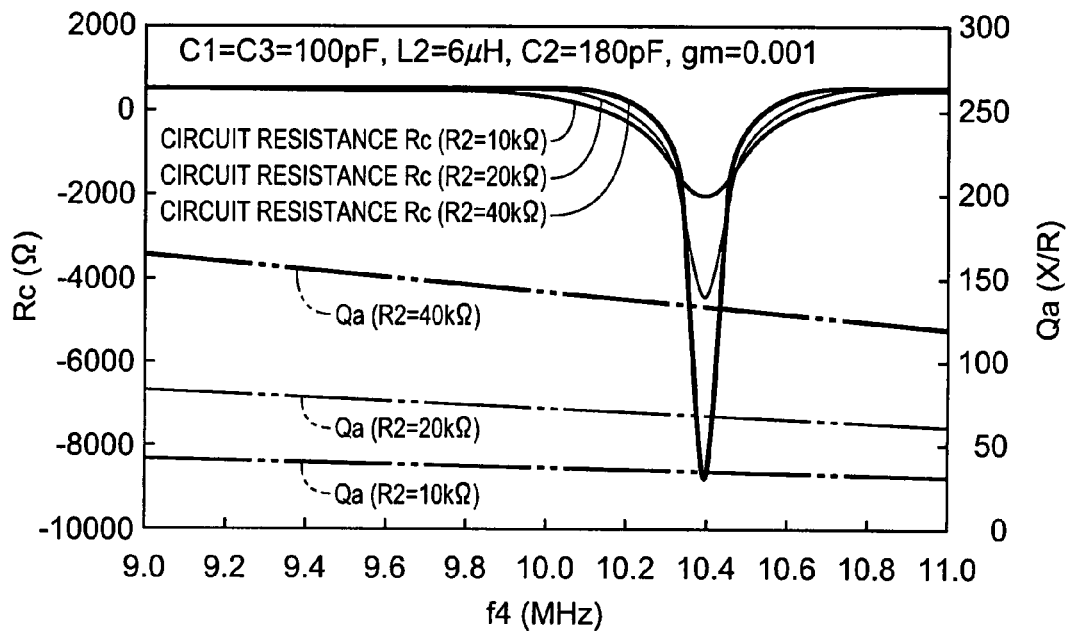
FIG. 15 is a diagram showing simulation results (2) of the oscillation circuit of the fourth example.

With respect to the equations 28 and 29, when the resistor R2 is used as the parameter, and when a simulation is performed provided that the capacitors C1=C3=100 pF, the inductor L2=6 µH, the capacitor C2=180 pF, and the mutual conductance gm=0.001, a graph as shown in FIG. 15 is obtained. Referring to the graph of FIG. 15, the circuit resistance Rc has the narrow band characteristics for each resistor R2 being 40 kΩ, 20 kΩ, and 10 kΩ. Roughly stated, the circuit resistance Rc at 10.4 MHz has the minimum values of −2.0 kΩ, −4.5 kΩ, and −8.6 kΩ, respectively.

Figure 16:
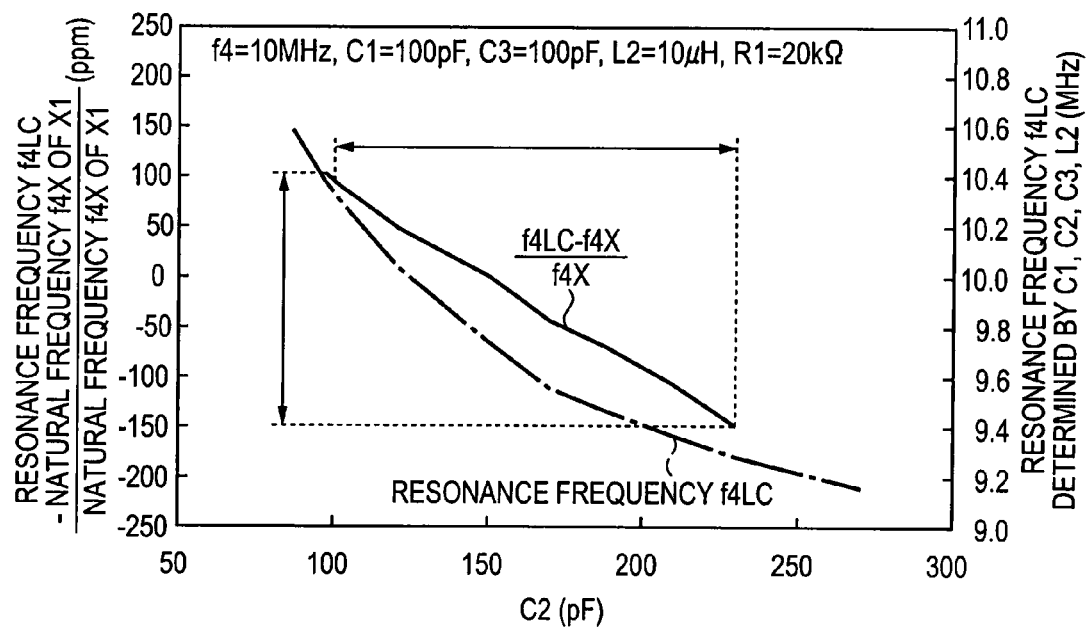
FIG. 16 is a diagram showing experimental results (1) of the oscillation circuit of the fourth example.

FIG. 16 shows the experimental results of the oscillation circuit of the example 4. In this experiment, the oscillation frequency f4=10 MHz, the capacitor C1=100 pF, the capacitor C3=100 pF, the inductor L2=10 µH, and the resistor R1=20 kΩ. Referring to FIG. 16, by changing the values of the capacitor C2, the resonance frequency f4LC determined by the capacitors C1, C2, C3 and the inductor L2 changes. For example, if (resonance frequency f4LC—natural frequency f4X)/natural frequency f4X (corresponding to the vertical axis) is in the range of from 100 ppm to 150 ppm, in other words, if the capacitor C2 (corresponding to the horizontal axis) is in the range of from 100 pF to 230 pF, the oscillation circuit OSC4 starts the oscillation at the resonance frequency f4LC at the initial stage and, at the steady-state stage, oscillates at the resonance frequency f4X.

Figure 17:
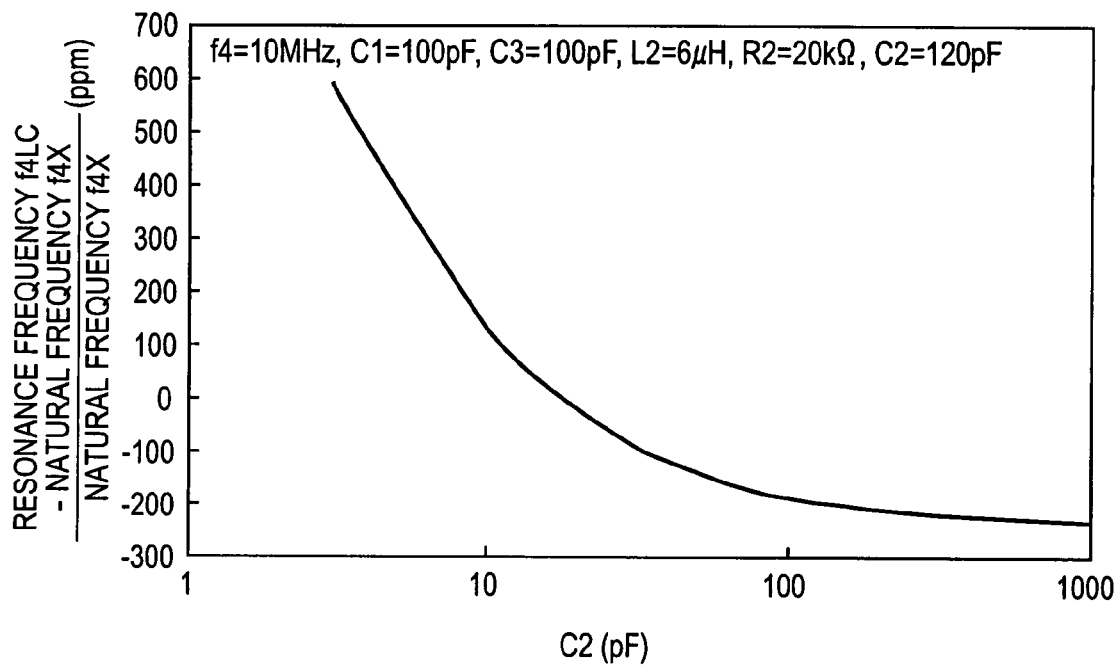
FIG. 17 is a diagram showing experimental results (2) of the oscillation circuit of the fourth example.
Figure 18:
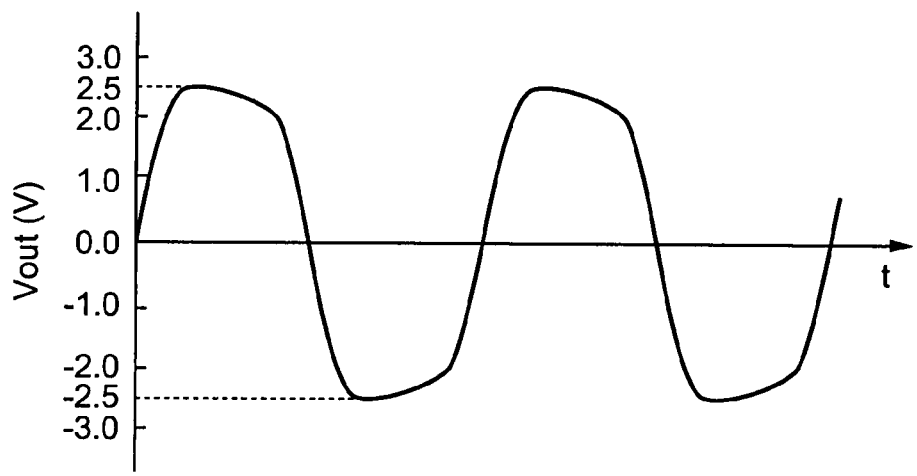
FIG. 18 is a diagram showing experimental results (3) of the oscillation circuit of the fourth example.

FIG. 17 shows other experimental results of the oscillation circuit of the example 4. In this experiment, the oscillation frequency f4=10 MHz, the capacitor C1=100 pF, the capacitor C3=100 pF, and the resistor R2=20 kΩ. Referring to FIG. 17, by changing the values of the capacitor C2, (resonance frequency f4LC—natural frequency f4X)/natural frequency f4X changes. For example, referring to FIG. 18, if the capacitor C2=120 pF, it is possible to obtain the oscillation signal OS4 having the waveform relatively close to that of the sinusoidal wave.

Figure 19:
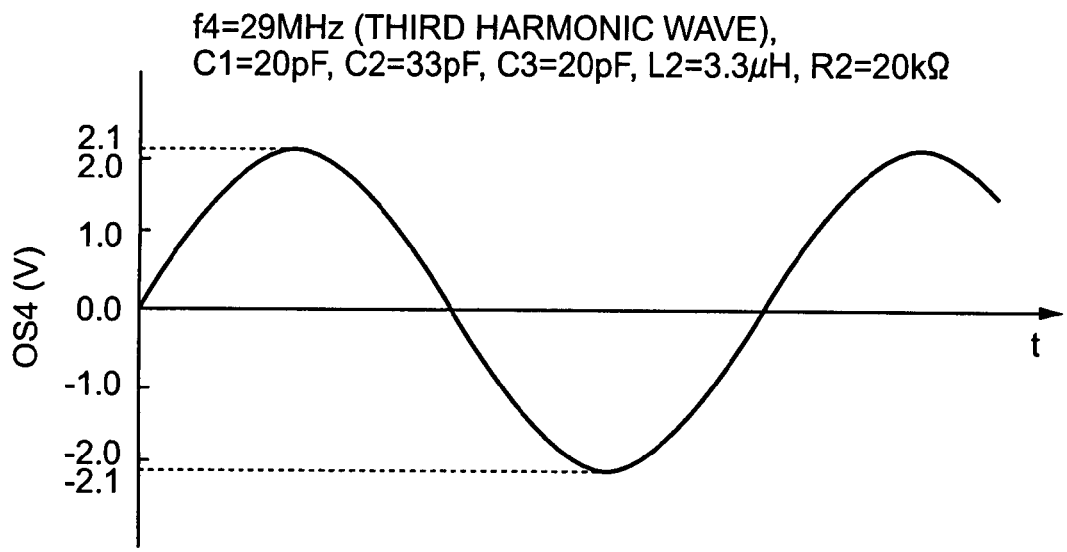
FIG. 19 is a diagram showing experimental results (4) of the oscillation circuit of the fourth example.

FIG. 19 shows yet other experimental results of the oscillation circuit of the example 4. In this experiment, the oscillation frequency f4=29 MHz (third harmonic wave), the capacitor C1=20 pF, the capacitor C2=33 pF, the capacitor C3=20 pF, the inductor L2=3.3 µH, and the resistor R2=20 kΩ. Referring to FIG. 19, it is possible to obtain the oscillation signal OS4 having the waveform even closer to that of the sinusoidal wave when compared to the oscillation signal OS4 illustrated in FIG. 18.

MODIFIED EXAMPLE 1

Figure 20:
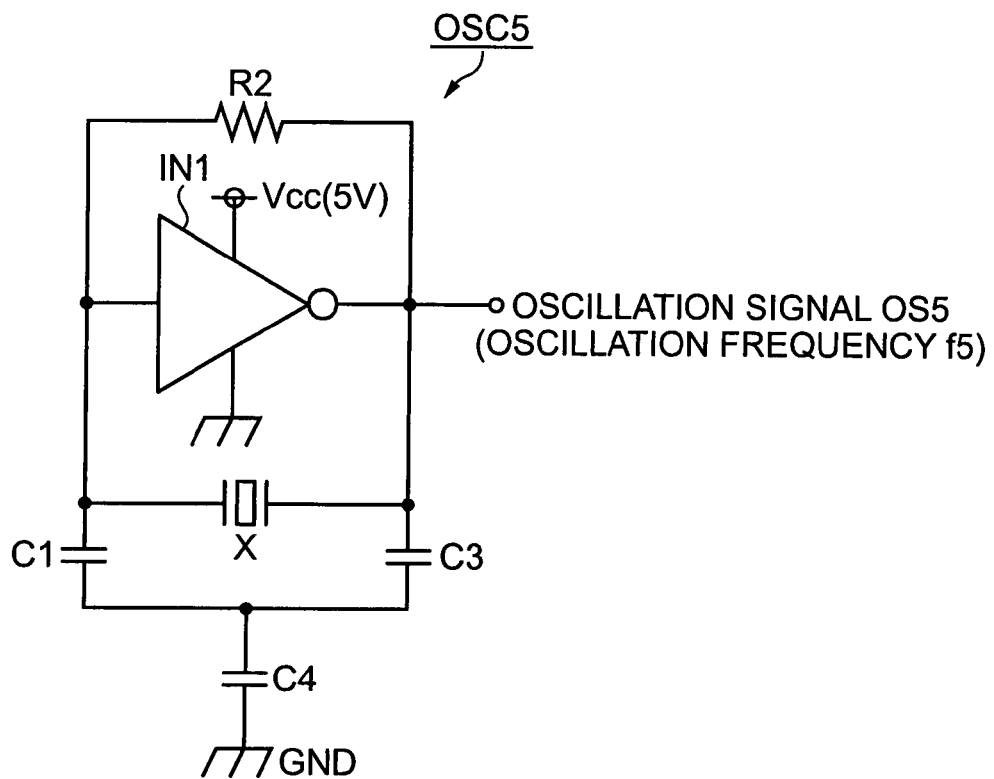
FIG. 20 is a diagram showing the structure of an oscillation circuit of a first modified example.

FIG. 20 is a circuit diagram of an oscillation circuit of a modified example 1. An oscillation circuit OSC5 of the modified example 1 basically has the same composition as that of the oscillation circuit OSC1 of the example 1 (shown in FIG. 1). On the contrary, unlike the oscillation circuit OSC1 of the example 1, the oscillation circuit OSC5 has a capacitor C4 as the fourth impedance z4 and in place of the resistor R4.

Figure 21:
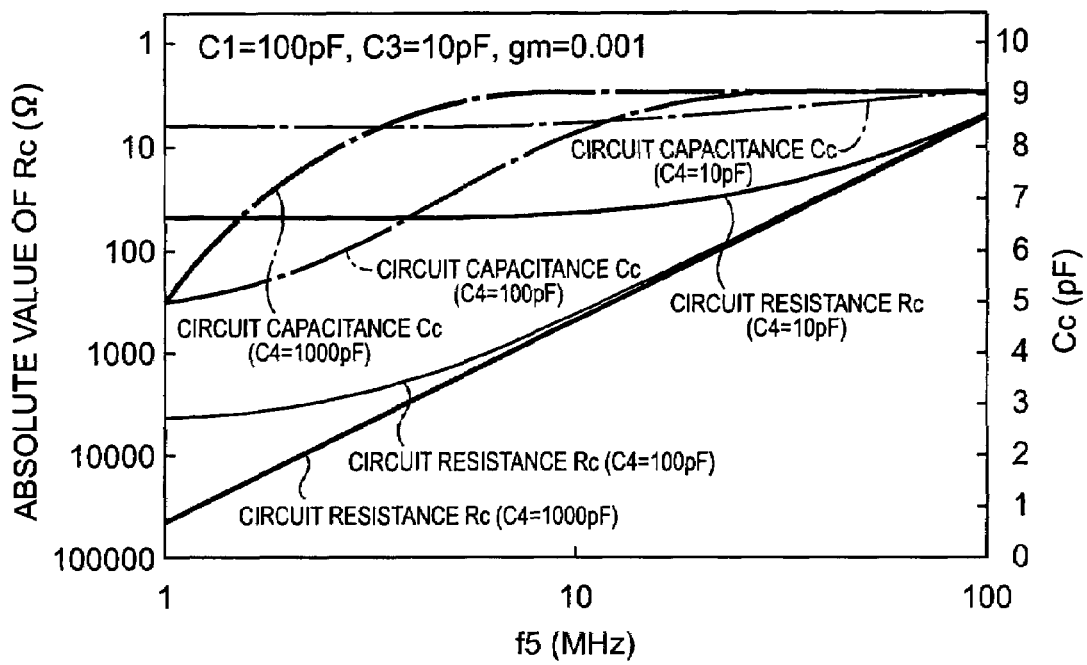
FIG. 21 is a diagram showing experimental results of the oscillation circuit of the first modified example.

FIG. 21 shows the experimental results of the oscillation circuit of the modified example 1. In this experiment, the capacitor C1=100 pF, the capacitor C3=10 pF, and the mutual conductance gm=0.001. Referring to FIG. 21, by changing the capacitor C4, more specifically, by changing the capacitor C4 from 10 pF to 100 pF to 1,000 pF, the value of the circuit resistance Rc (absolute value) can be made relatively small, and, consequently, it is possible that an oscillation signal OS5 has the waveform close to that of the sinusoidal wave.

MODIFIED EXAMPLE 2

Figure 22:
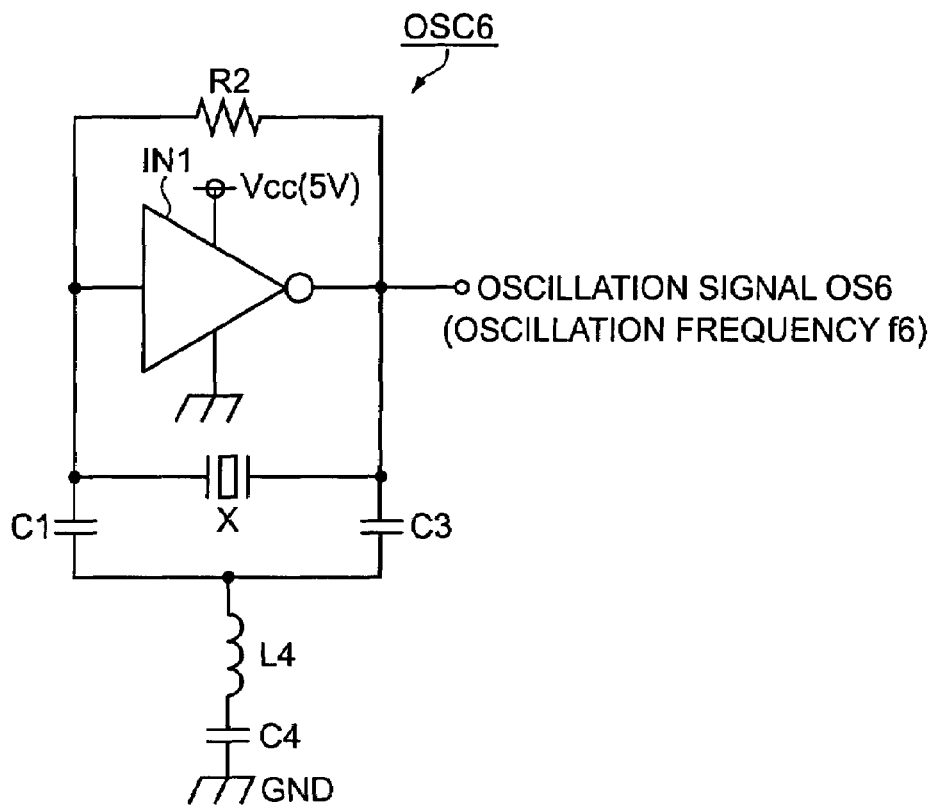
FIG. 22 is a diagram showing the structure of an oscillation circuit of a second modified example.

FIG. 22 is a circuit diagram of an oscillation circuit of a modified example 2. An oscillation circuit OSC6 of the modified example 2 basically has the same composition as that of the oscillation circuit OSC1 of the example 1 (shown in FIG. 1). In contrast, unlike the oscillation circuit OSC1 of the example 1, the oscillation circuit OSC6 includes the capacitor C4 and an inductor L4 composing a serial resonance circuit as the fourth impedance z4 and in place of the resistor R4.

Figure 23:
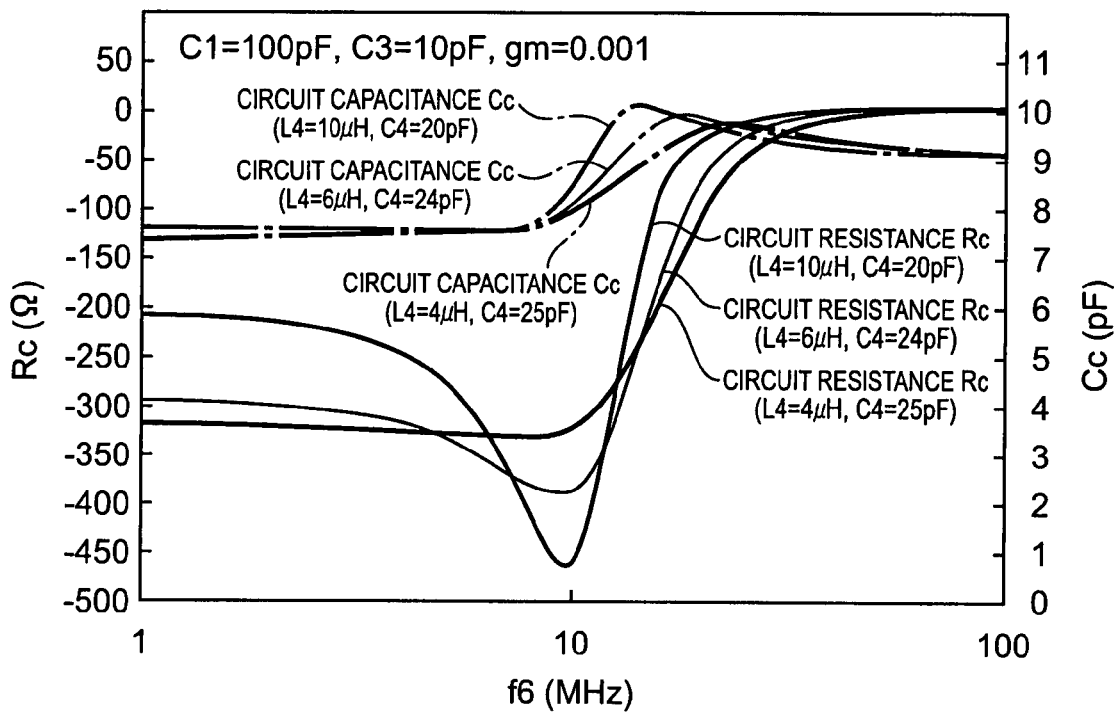
FIG. 23 is a diagram showing experimental results of the oscillation circuit of the second modified example.
Figure 24:
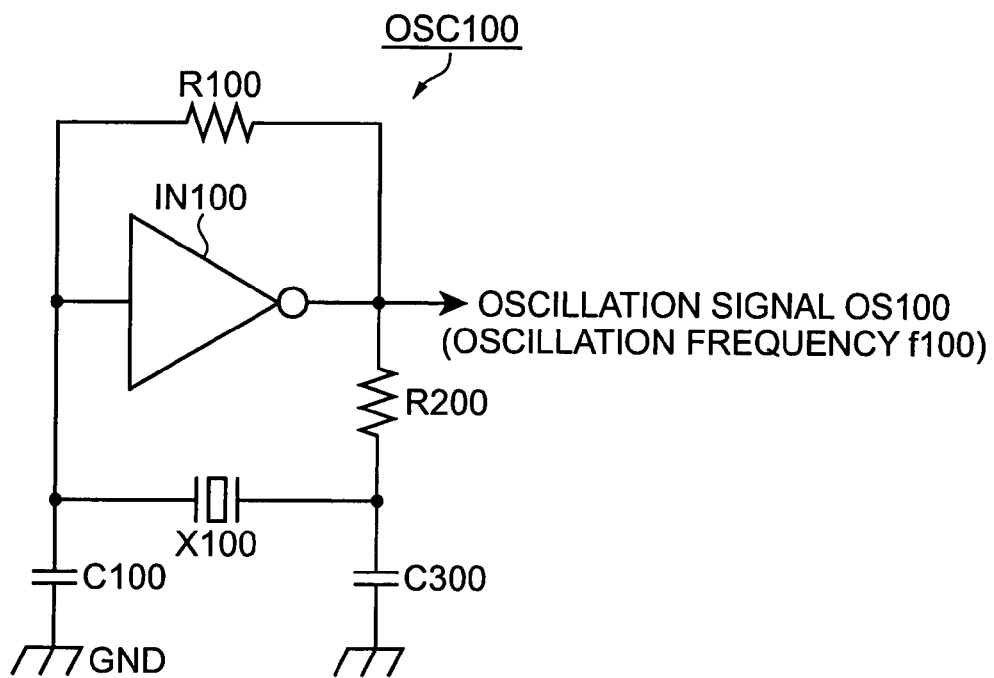
FIG. 24 is a circuit diagram showing the structure of an oscillation circuit of the related art.
Figure 25:
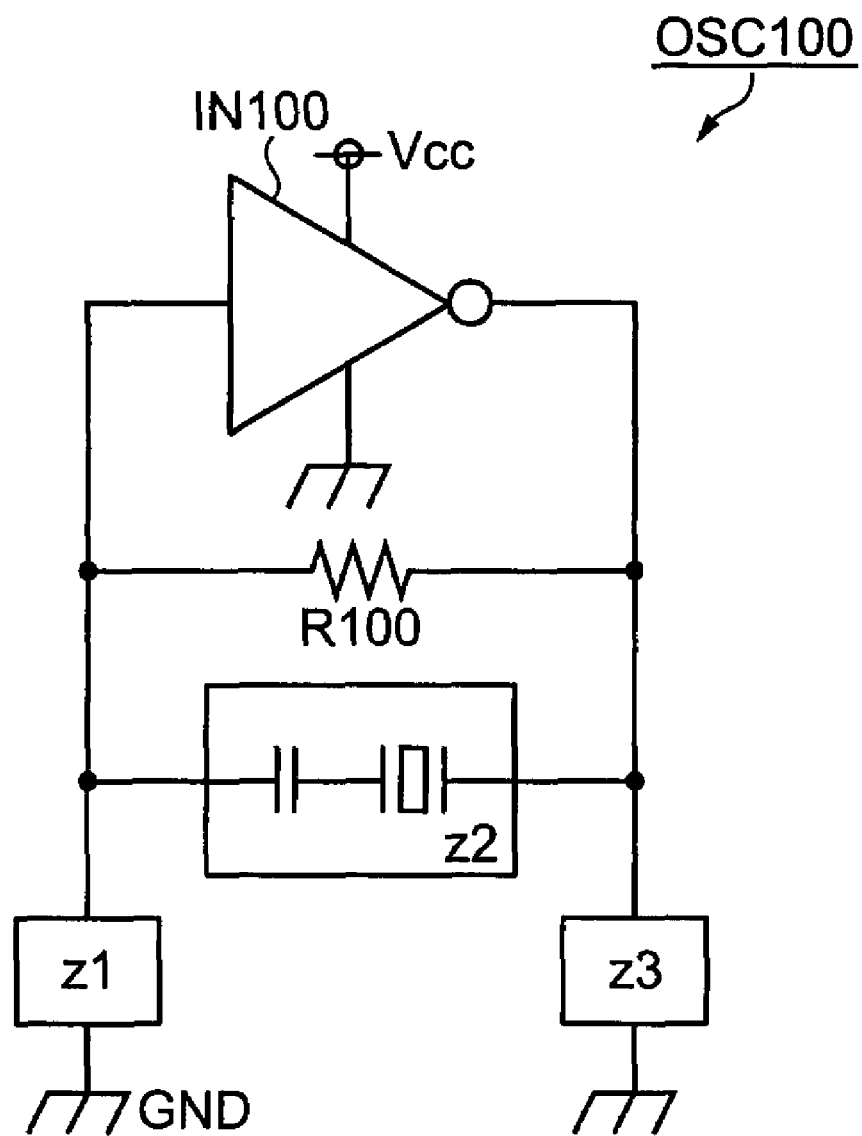
FIG. 25 is a block diagram showing an equivalent circuit of the oscillation circuit of the related art.
Figure 26:
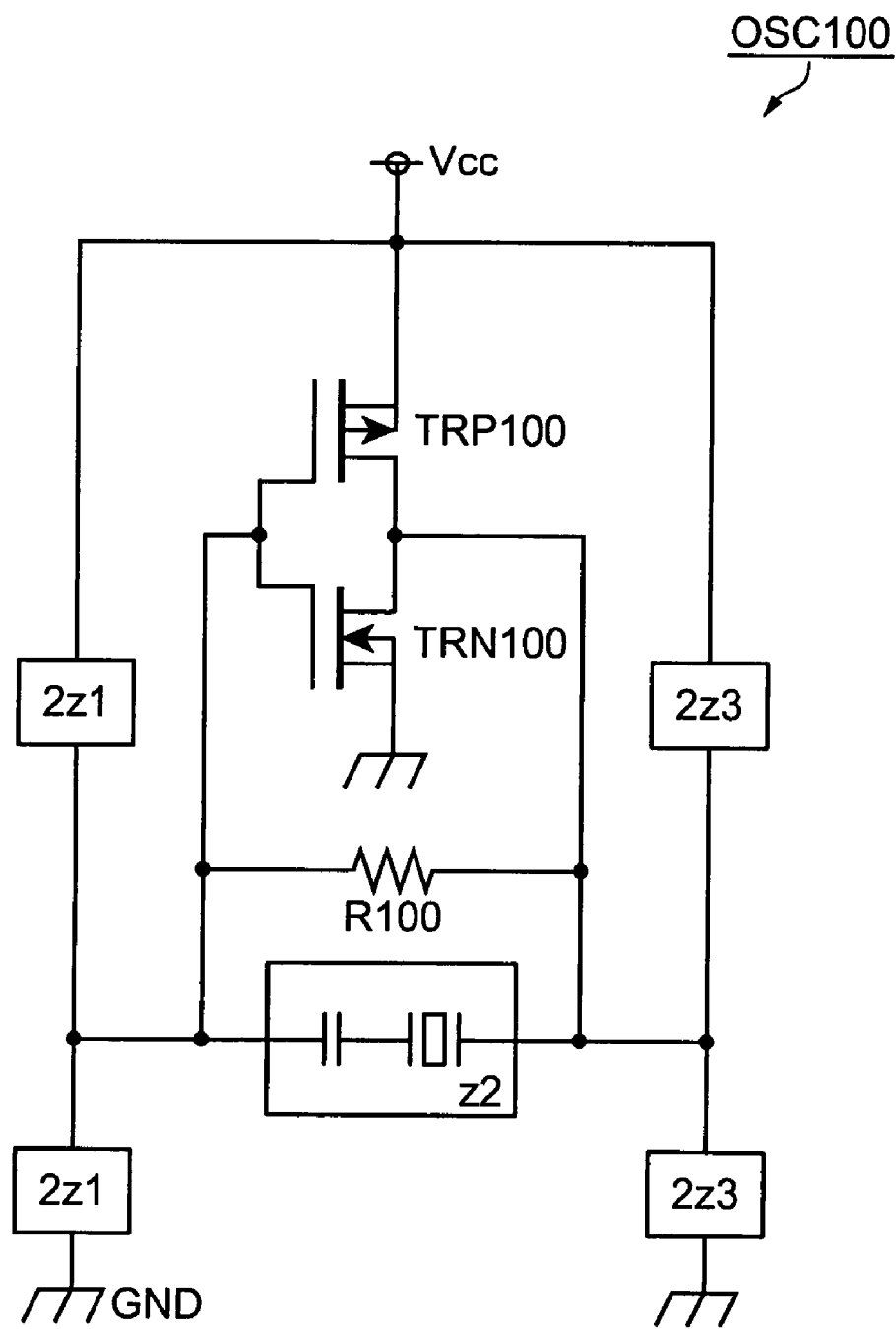
FIG. 26 is a block diagram showing another equivalent circuit of the oscillation circuit of the related art.
Figure 27:
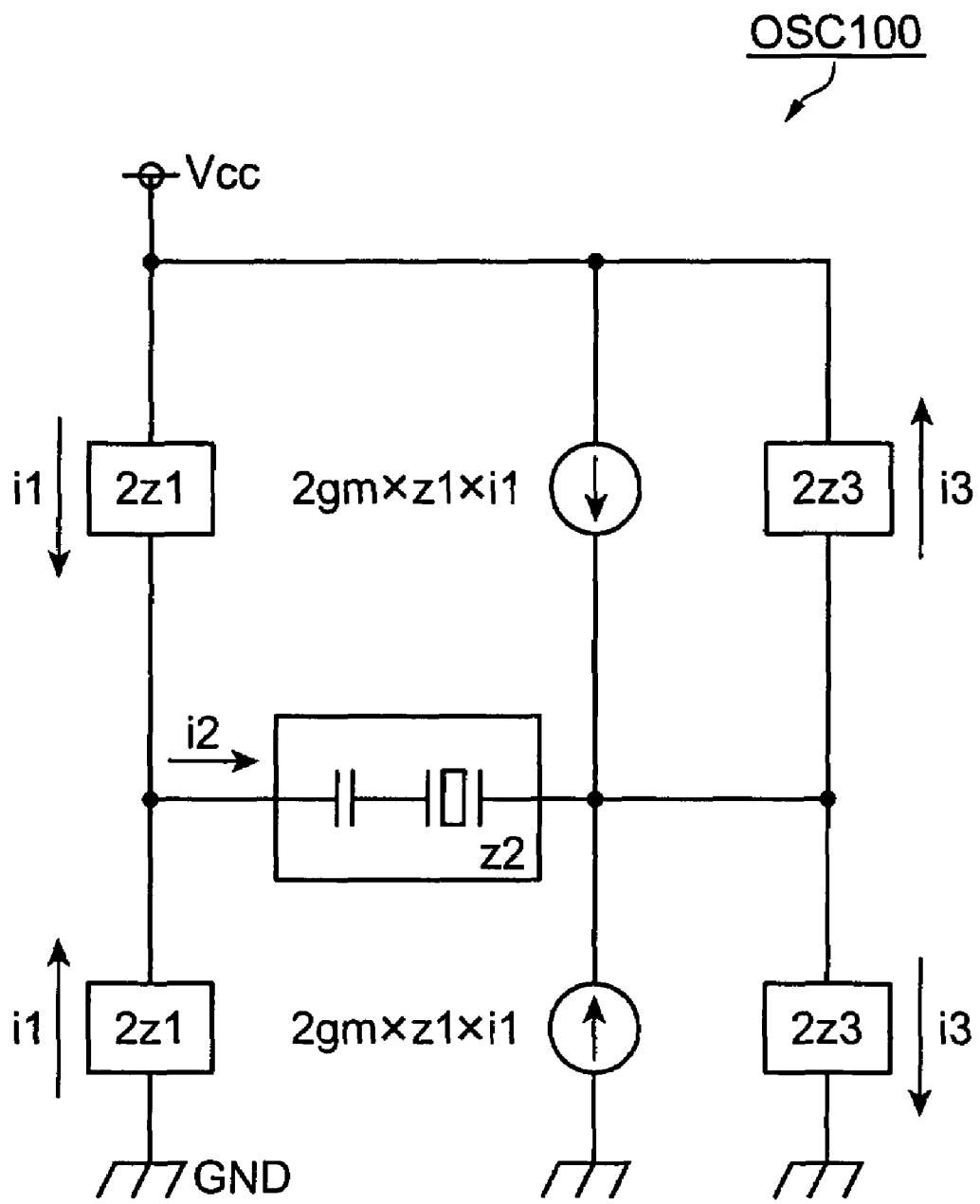
FIG. 27 is a block diagram showing yet another equivalent circuit of the oscillation circuit of the related art.
Figure 28:
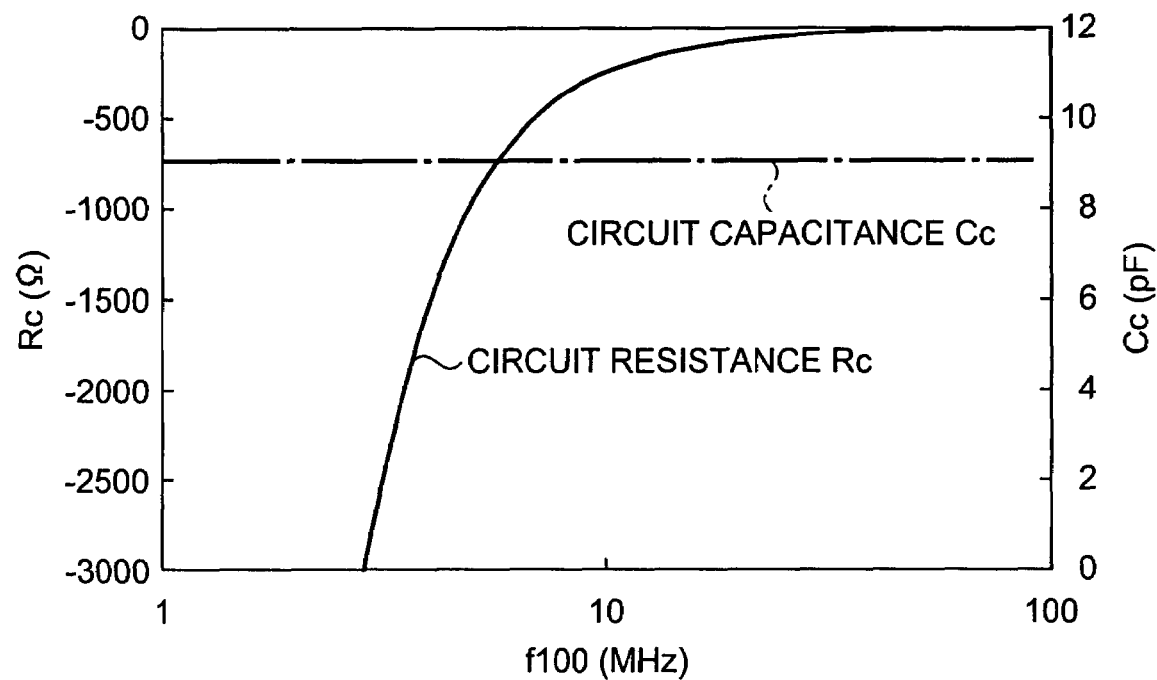
FIG. 28 is a diagram showing a circuit resistance and a circuit capacitance of the oscillation circuit of the related art.

FIG. 23 shows the experimental results of the oscillation circuit of the modified example 2. In this experiment, the capacitor C1=100 pF, the capacitor C3=10 pF, and the mutual conductance gm=0.001. Referring to FIG. 23, by changing the inductor L4 and the capacitor C4, more specifically, by changing the combinations of the inductor L4 and the capacitor C4, e.g., 10 µH and 20 pF→6 µH and 24 pF→4 µH and 25 pF, the circuit resistance Rc exhibits such sharp characteristics that the value (absolute value) is at its maximum at approximately 10 MHz.

What is claimed is:
1. An oscillation circuit, comprising:
   a complementary metal oxide semiconductor (CMOS) inverter coupled between a first potential and a second potential;

a first element unit whose one terminal is coupled to an input terminal of the CMOS inverter;

a second element unit whose one terminal is coupled to the input terminal of the CMOS inverter and whose other terminal is coupled to an output terminal of the CMOS inverter;

a third element unit whose one terminal is coupled to the output terminal of the CMOS inverter; and a fourth element unit whose one terminal is coupled to the other terminal of the first element unit and to the other terminal of the third element unit, and whose other terminal is coupled to either the first potential or the second potential; wherein:

the first, second, third, and fourth element units are any of a quartz crystal resonator, a resistor, an inductor, and a capacitor;

the oscillation circuit oscillating at a frequency determined by the first, second, and third element units.

2. The oscillation circuit according to claim 1, wherein:
the first and third element units are capacitors;
the second element unit is a quartz crystal resonator; and
the fourth element unit is a resistor.

3. The oscillation circuit according to claim 1, wherein:
the first element unit is a quartz crystal resonator;
the second element unit is a capacitor;
the third element unit is an inductor; and
the fourth element unit is a resistor.

4. The oscillation circuit according to claim 1, wherein:
the first element unit is an inductor;
the second element unit is a capacitor;
the third element unit is a quartz crystal resonator; and
the fourth element unit is a resistor.

5. The oscillation circuit according to claim 1, wherein:
the first and third element units are capacitors;
the second element unit is a capacitor and an inductor connected serially to each other; and
the fourth element unit is a quartz crystal resonator.

6. The oscillation circuit according to claim 1, wherein:
the first, third, and fourth element units are capacitors; and
the second element unit is a quartz crystal resonator.

7. The oscillation circuit according to claim 1, wherein:
the first and third element units are capacitors;
the second element unit is a quartz crystal resonator; and
the fourth element unit is an inductor and a capacitor connected serially to each other.

* * * * *